(12) United States Patent
Su et al.

(10) Patent No.: US 11,698,468 B2
(45) Date of Patent: Jul. 11, 2023

(54) RADIATION DETECTOR, METHOD OF OPERATING RADIATION DETECTOR, AND METHOD OF FABRICATING RADIATION DETECTOR

(71) Applicants: BEIJING BOE OPTOELECTRONICS TECHNOLOGY CO., LTD., Beijing (CN); BOE Technology Group Co., Ltd., Beijing (CN)

(72) Inventors: Jingjie Su, Beijing (CN); Zhi Ding, Beijing (CN); Dexi Kong, Beijing (CN); Xuecheng Hou, Beijing (CN); Xiangmi Zhan, Beijing (CN); Guan Zhang, Beijing (CN); Kunjing Chung, Beijing (CN); Huinan Xia, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 471 days.

(21) Appl. No.: 16/969,651

(22) PCT Filed: Oct. 25, 2019

(86) PCT No.: PCT/CN2019/113277
§ 371 (c)(1),
(2) Date: Aug. 13, 2020

(87) PCT Pub. No.: WO2021/077403
PCT Pub. Date: Apr. 29, 2021

(65) Prior Publication Data
US 2023/0097928 A1   Mar. 30, 2023

(51) Int. Cl.
*G01T 1/20* (2006.01)
*H01L 27/146* (2006.01)

(52) U.S. Cl.
CPC ...... *G01T 1/2018* (2013.01); *H01L 27/14623* (2013.01); *H01L 27/14629* (2013.01);
(Continued)

(58) Field of Classification Search
CPC ............ G01T 1/2018; H01L 27/14623; H01L 27/14629; H01L 27/14663;
(Continued)

(56) References Cited

U.S. PATENT DOCUMENTS

| 2015/0041870 A1 | 2/2015 | Xu et al. |
| 2016/0127668 A1* | 5/2016 | Fujita ................ H01L 27/14663 348/308 |

(Continued)

FOREIGN PATENT DOCUMENTS

| CN | 101859838 A | 10/2010 |
| CN | 102832222 A | 12/2012 |
| CN | 110034134 A | 7/2019 |

OTHER PUBLICATIONS

International Search Report & Written Opinion dated Jul. 29, 2020, regarding PCT/CN2019/113277.

*Primary Examiner* — Kiho Kim
(74) *Attorney, Agent, or Firm* — Intellectual Valley Law, P.C.

(57) ABSTRACT

A radiation detector having a plurality of pixels is provided. A respective one of the plurality of pixels includes a base substrate; a thin film transistor on the base substrate; an insulating layer on a side of the thin film transistor away from the base substrate; a photosensor on a side of the insulating layer away from the base substrate; a passivation layer on a side of the photosensor away from the base
(Continued)

substrate; a scintillation layer on a side of the passivation layer away from the base substrate; and a reflective layer on a side of the scintillation layer away from the base substrate. The photosensor includes a first polarity layer in direct contact with the passivation layer. All sides of the first polarity layer other than a side internal to the photosensor are entirely in direct contact with the passivation layer.

17 Claims, 9 Drawing Sheets

(52) U.S. Cl.
CPC .. *H01L 27/14663* (2013.01); *H01L 27/14685* (2013.01); *H01L 27/14689* (2013.01); *H01L 27/14692* (2013.01)

(58) Field of Classification Search
CPC ......... H01L 27/14685; H01L 27/14689; H01L 27/14692
See application file for complete search history.

(56) References Cited

U.S. PATENT DOCUMENTS

| | | | |
|---|---|---|---|
| 2016/0365381 A1* | 12/2016 | Zhao | ............... G01T 1/2018 |
| 2019/0049597 A1 | 2/2019 | Tian | |
| 2019/0115377 A1 | 4/2019 | Huang | |
| 2019/0198557 A1 | 6/2019 | Yang | |

* cited by examiner

RADIATION DETECTOR, METHOD OF OPERATING RADIATION DETECTOR, AND METHOD OF FABRICATING RADIATION DETECTOR

CROSS-REFERENCE TO RELATED APPLICATION

This application is a national stage application under 35 U.S.C. § 371 of International Application No. PCT/CN2019/113277, filed Oct. 25, 2019, the contents of which are incorporated by reference in the entirety.

TECHNICAL FIELD

The present invention relates to radiation detection technology, more particularly, to a radiation detector, a method of operating a radiation detector, and a method of fabricating a radiation detector.

BACKGROUND

A direct conversion radiation detector typically includes a radiation receiver, a processor, and a power supply. Typically, the radiation receiver has a scintillation layer made of $Gd_2O_2S$ or CsI, a large-area amorphous silicon sensor array, and a readout circuit. The scintillation layer converts the radiation (e.g., X-ray photons) into visible light. The large-scale integrated amorphous silicon sensor array then converts the visible light into electrons, which are then digitized by the readout circuit. The digitized signal is transmitted to a computer for image display.

An indirect conversion radiation detector typically includes a scintillation layer made of $Gd_2O_2S$ or CsI, a PIN photodiode, and a thin film transistor array. The scintillation layer converts the radiation (e.g., X-ray photons) into visible light. The PIN photodiode converts the visible light into electrical signals for image display.

SUMMARY

In one aspect, the present invention provides a radiation detector having a plurality of pixels, wherein a respective one of the plurality of pixels comprises a base substrate; a thin film transistor on the base substrate; an insulating layer on a side of the thin film transistor away from the base substrate; a photosensor on a side of the insulating layer away from the base substrate; a passivation layer on a side of the photosensor away from the base substrate; a scintillation layer on a side of the passivation layer away from the base substrate; and a reflective layer on a side of the scintillation layer away from the base substrate; wherein the photosensor comprises a first polarity layer in direct contact with the passivation layer, and a second polarity layer connected to a source electrode of the thin film transistor; and wherein all sides of the first polarity layer other than a side internal to the photosensor are entirely in direct contact with the passivation layer.

Optionally, the radiation detector is absent of any bias voltage signal line connected to the first polarity layer, and is absent of any bias electrode directly connected to the first polarity layer.

Optionally, the passivation layer is a unitary layer extending throughout the plurality of pixels; and in the plurality of pixels, the radiation detector is substantially absent of any via extending through the passivation layer.

Optionally, the first polarity layer is spaced apart from the scintillation layer by the passivation layer; and the passivation layer is in direct contact with the scintillation layer on a first side, and is in direct contact with the first polarity layer on a second side opposite to the first side, in a region corresponding to the photosensor.

Optionally, the radiation detector further includes a metallic layer on a side of the insulating layer away from the base substrate; wherein the metallic layer comprises a first part and a second part in a same layer and spaced apart from each other; the first part is on a side of the insulating layer away from an active layer of the thin film transistor, and configured to shield light from irradiating on the active layer; and the second part is between the insulating layer and the second polarity layer, is electrically connected to the second polarity layer, and extends through the insulating layer to connect to a source electrode of the thin film transistor.

Optionally, the passivation layer is in direct contact with the scintillation layer on a first side, and is in direct contact with the first part on a second side opposite to the first side, in a region corresponding to the first part.

Optionally, an orthographic projection of the first part on the base substrate is completely non-overlapping with an orthographic projection of the photosensor on the base substrate; and the orthographic projection of the first part on the base substrate covers an orthographic projection of the active layer on the base substrate.

Optionally, an orthographic projection of the photosensor on the base substrate is substantially non-overlapping with an orthographic projection on the base substrate of any metallic layer between the second part and the reflective layer.

Optionally, the radiation detector is absent of any via extending through the passivation layer in a region corresponding to the photosensor to connect components on two sides of the passivation layer.

Optionally, the reflective layer is a unitary layer extending throughout the plurality of pixels.

Optionally, the radiation detector is an x-ray detector.

In another aspect, the present invention provides a method of operating a radiation detector, wherein the radiation detector comprises a plurality of pixels, wherein a respective one of the plurality of pixels comprises a base substrate; a thin film transistor on the base substrate; an insulating layer on a side of the thin film transistor away from the base substrate; a photosensor on a side of the insulating layer away from the base substrate; a passivation layer on a side of the photosensor away from the base substrate; a scintillation layer on a side of the passivation layer away from the base substrate; and a reflective layer on a side of the scintillation layer away from the base substrate; wherein the photosensor comprises a first polarity layer in direct contact with the passivation layer, and a second polarity layer connected to a source electrode of the thin film transistor; and wherein all sides of the first polarity layer other than a side internal to the photosensor are entirely in direct contact with the passivation layer; wherein the method comprises providing a bias voltage to the first polarity layer by providing a voltage signal to the reflective layer to achieve the bias voltage at the first polarity layer.

Optionally, the voltage signal provided to the reflective layer is a first negative voltage; the bias voltage has a second negative voltage; and an absolute value of the first negative voltage is greater than an absolute value of the second negative voltage.

In another aspect, the present invention provides a method of fabricating a radiation detector having a plurality of pixels; wherein fabricating a respective one of the plurality of pixels comprises forming a thin film transistor on a base substrate; forming an insulating layer on a side of the thin film transistor away from the base substrate; forming a photosensor on a side of the insulating layer away from the base substrate; forming a passivation layer on a side of the photosensor away from the base substrate; forming a scintillation layer on a side of the passivation layer away from the base substrate; and forming a reflective layer on a side of the scintillation layer away from the base substrate; wherein forming the photosensor comprises forming a first polarity layer and forming a second polarity layer; the first polarity layer is formed to be in direct contact with the passivation layer; the second polarity layer is formed to be connected to a source electrode of the thin film transistor; wherein all sides of the first polarity layer other than a side internal to the photosensor are entirely in direct contact with the passivation layer.

Optionally, a total number of steps of depositing an insulating material, subsequent to forming the photosensor and prior to forming the scintillation layer, is one.

Optionally, the method further comprises forming a metallic layer on a side of the insulating layer away from the base substrate; wherein forming the metallic layer comprises forming a first part and forming a second part in a same layer and spaced apart from each other; the first part and the second part are formed in a same patterning process using a same mask plate and a same material; the first part is formed on a side of the insulating layer away from an active layer of the thin film transistor, and configured to shield light from irradiating on the active layer; and the second part is formed between the insulating layer and the second polarity layer, is electrically connected to the second polarity layer, and extends through the insulating layer to connect to a source electrode of the thin film transistor.

Optionally, forming the passivation layer comprises depositing an insulating material in direct contact with the photosensor and the metallic layer, subsequent to forming the photosensor, without any intermediate deposition step; no via connecting components on two sides of the passivation layer is formed to extend through the passivation layer in a region corresponding to the photosensor; and forming the scintillation layer comprises depositing a scintillation material, subsequent to forming the passivation layer, without any intermediate deposition step, the scintillation material is deposited to be in direct contact with the passivation layer.

Optionally, the metallic layer and the photosensor are formed so that an orthographic projection of the first part on the base substrate is completely non-overlapping with an orthographic projection of the photosensor on the base substrate.

Optionally, the photosensor are formed so that an orthographic projection of the photosensor on the base substrate is substantially non-overlapping with an orthographic projection on the base substrate of any metallic layer between the second part and the reflective layer.

Optionally, the first polarity layer is formed to be spaced apart from the scintillation layer by the passivation layer; and the passivation layer is formed to be in direct contact with the scintillation layer on a first side, and in direct contact with the first polarity layer on a second side opposite to the first side, in a region corresponding to the photosensor.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1A:
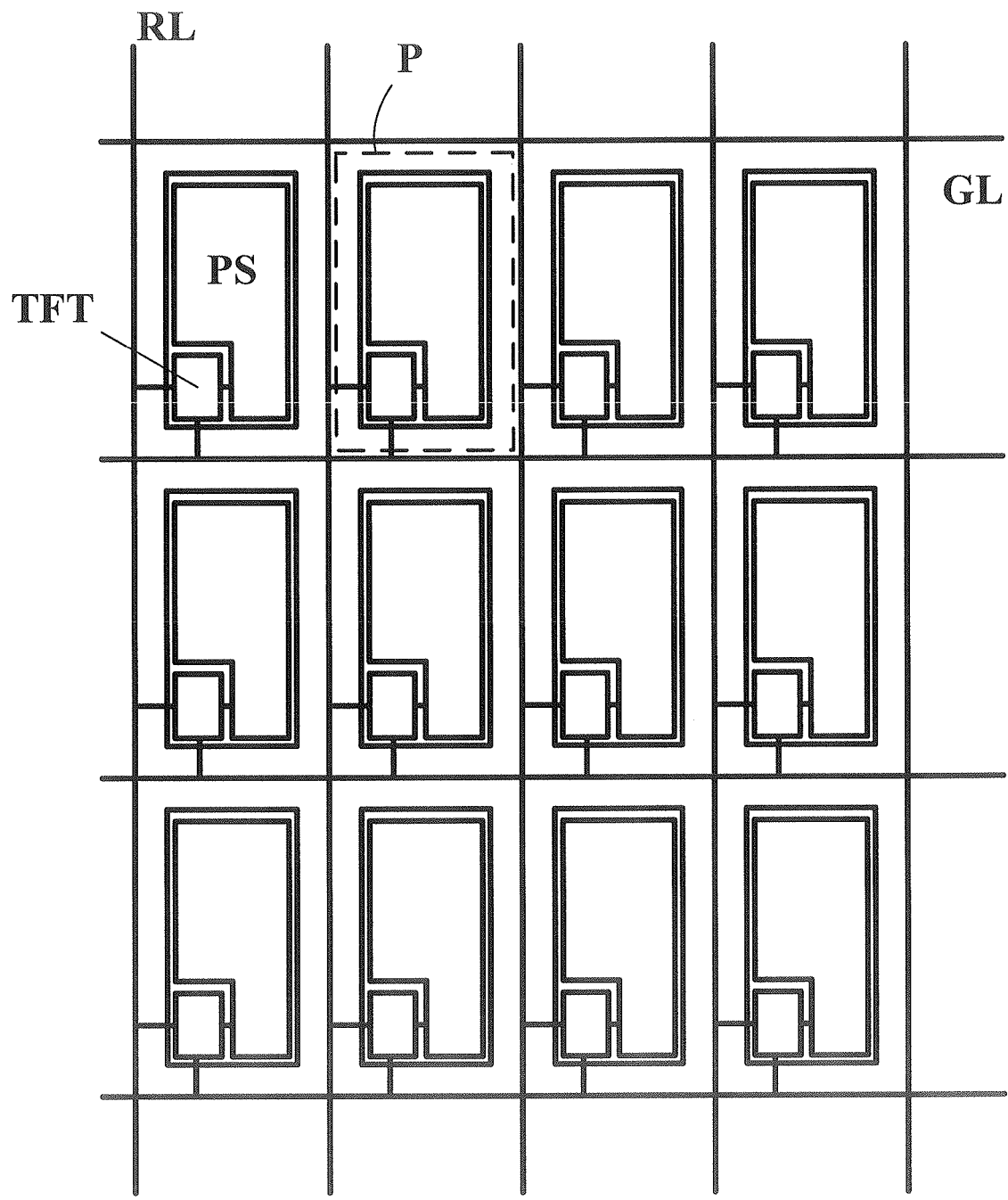
FIG. 1A is a schematic diagram illustrating the structure of a radiation detector in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In a radiation detector, radiation is converted into visible light, the visible light is detected by a photosensor. Related radiation detectors include a scintillation layer for converting the radiation into the visible light, and multiple layers between the scintillation layer and the photosensor. Thus, in related radiation detectors, before it is detected by the photosensor, the visible light has to transmit through the multiple layers, including a plurality of passivation layers, a resin layer, a metallic light shielding layer, and an indium tin oxide bias electrode. The presence of the multiple layers in the related radiation detectors results in significant energy loss of the visible light and a relatively low energy utilization.

Accordingly, the present disclosure provides, inter alia, a radiation detector, a method of operating a radiation detector, and a method of fabricating a radiation detector that substantially obviate one or more of the problems due to limitations and disadvantages of the related art. In one aspect, the present disclosure provides a radiation detector having a plurality of pixels. In some embodiments, a respective one of the plurality of pixels includes a base substrate; a thin film transistor on the base substrate; an insulating layer on a side of the thin film transistor away from the base substrate; a photosensor on a side of the insulating layer away from the base substrate; a passivation layer on a side of the photosensor away from the base substrate; a scintillation layer on a side of the passivation layer away from the base substrate; and a reflective layer on a side of the scintillation layer away from the base substrate. Optionally, the photosensor includes a first polarity layer in direct contact with the passivation layer and a second polarity layer connected to a source electrode of the thin film transistor. Optionally, all sides of the first polarity layer other than a side internal to the photosensor are entirely in direct contact with the passivation layer.

The present radiation detector includes only one passivation layer between the scintillation layer and the photosensor. The radiation is converted into the visible light, which then transmits through an ultrathin passivation layer before it reaches the photosensor. The present radiation detector utilizes a reflective layer on a side of the scintillation layer away from the photosensor for applying a negative voltage, in order to achieve a bias voltage at the photosensor. Moreover, the present radiation detector is absent of any metallic light shielding layer and indium tin oxide bias electrode on top of the photosensor, significantly increasing a photosensing area of the photosensor and aperture ratio of pixels of the radiation detector. Further, multiple passivation layers and the resin layer in the related radiation detector is replaced by only one ultrathin passivation layer in the present radiation detector, leading to a significantly simplified fabrication process and much lowered manufacturing costs. The improved light utilization in the present radiation detector improves detection sensitivity of the present radiation detector, which in turn leads to a lower radiation dosage required to achieve a comparable imaging quality.

Figure 1B:
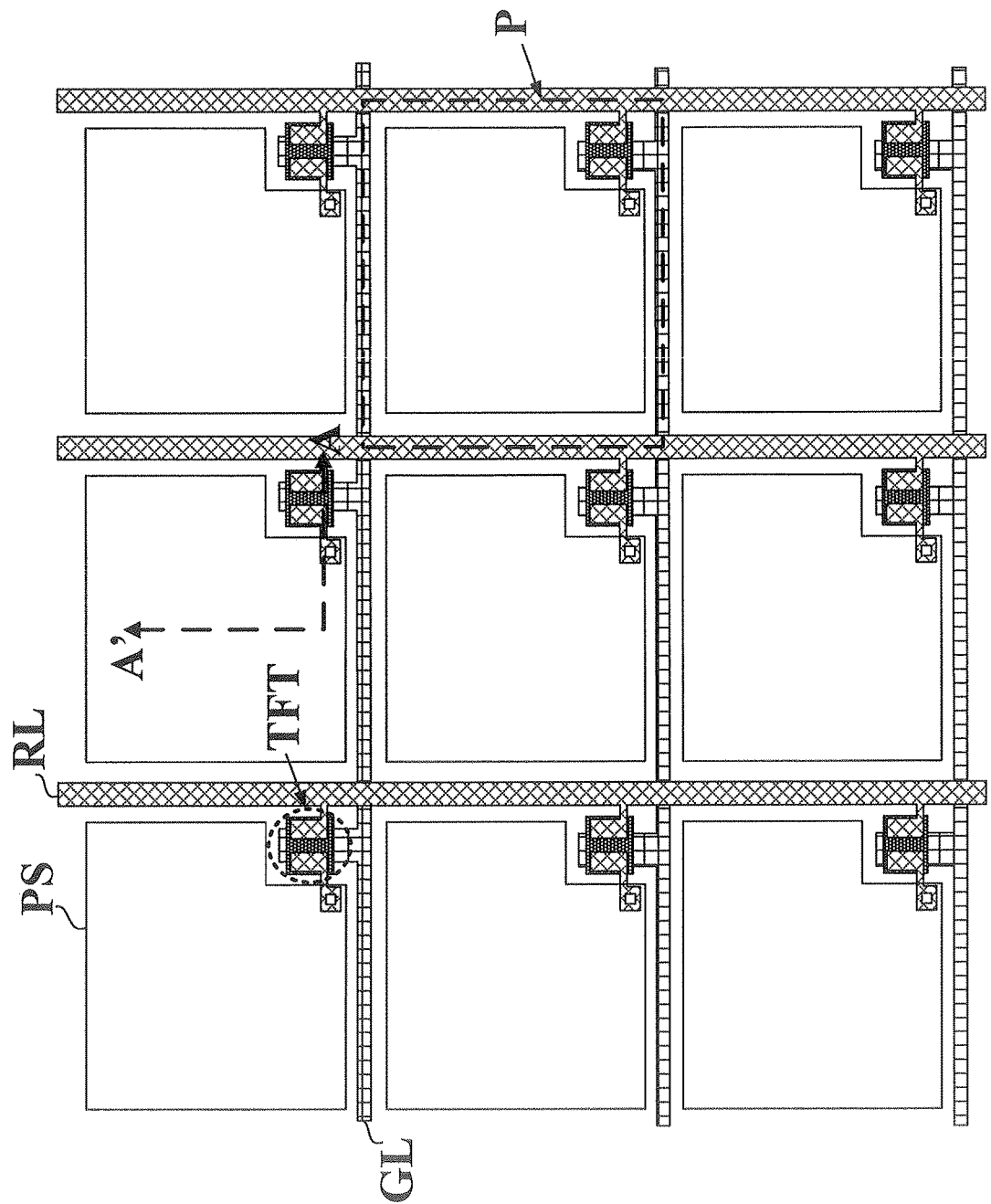
FIG. 1B is a plan view of a radiation detector in some embodiments according to the present disclosure.

FIG. 1A is a schematic diagram illustrating the structure of a radiation detector in some embodiments according to the present disclosure. FIG. 1B is a plan view of a radiation detector in some embodiments according to the present disclosure. Referring to FIG. 1A and FIG. 1B, the radiation detector in some embodiments includes a plurality of gate lines GL and a plurality of read lines RL crossing over each other, defining a plurality of pixels P. Each of the plurality of pixels P includes a thin film transistor TFT electrically connected to a photosensor PS. Each of the plurality of gate lines GL is connected to a row of pixels of the plurality of pixels P, and each of the plurality of read lines RL is connected to a column of pixels of the plurality of pixels P.

Figure 2:
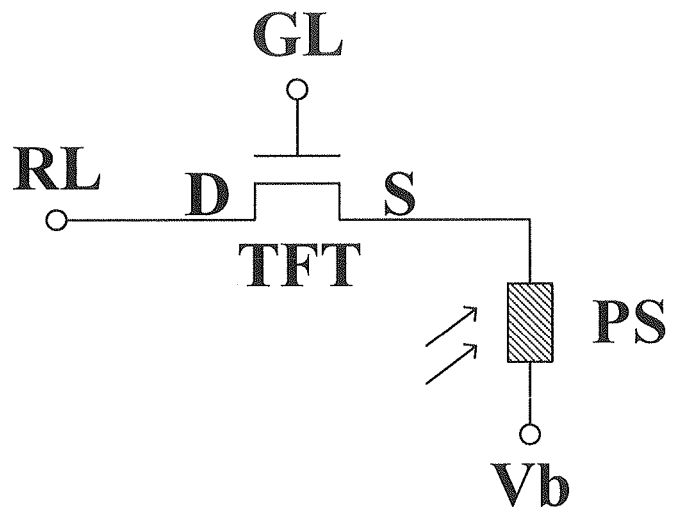
FIG. 2 is a circuit diagram of a photo-detection circuit in some embodiments according to the present disclosure.

FIG. 2 is a circuit diagram of a photo-detection circuit in some embodiments according to the present disclosure. Referring to FIG. 1 and FIG. 2, the photo-detection circuit in some embodiments includes a thin film transistor TFT and the photosensor PS electrically connected to each other. In some embodiments, a source electrode S of the thin film transistor TFT is electrically connected to the photosensor PS. A drain electrode D of the thin film transistors TFT is electrically connected to one of a plurality of read lines RL. Vb in FIG. 2 stands for a bias voltage provided to the photosensor PS, e.g., a bias voltage provided to a first polarity layer of the photosensor PS. Referring to FIG. 1 and FIG. 2, the drain electrode D of the thin film transistor TFT is electrically connected to a respective one of the plurality of read lines RL. When the thin film transistor TFT is turned on, a photo-sensing signal is transmitted from the source electrode S to the drain electrode D, and in turn to the respective one of the plurality of read lines RL.

Various appropriate photosensors having a diode junction may be utilized in making and using the present display panel. Examples of photosensors having a diode junction include, but are not limited to, a PN photodiode, a PIN photodiode, an avalanche photodiode, a MIM diode junction, a MIS diode junction, a MOS diode junction, a SIS diode junction, and a MS diode junction.

Figure 3:
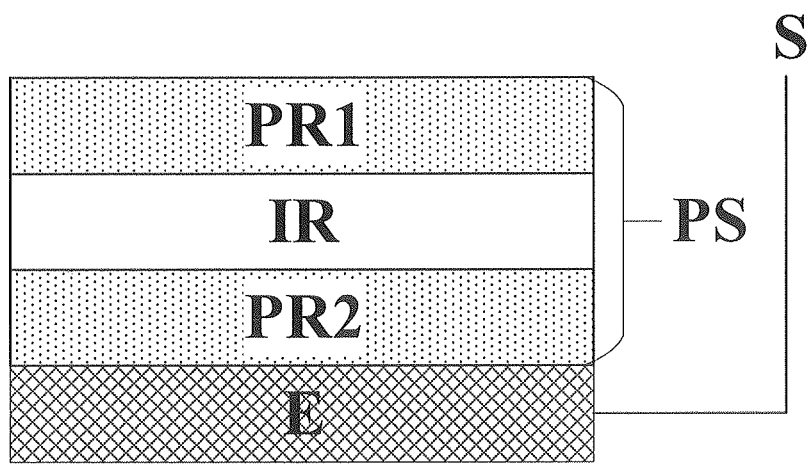
FIG. 3 illustrates the structure of a photosensor in some embodiments according to the present disclosure.

FIG. 3 illustrates the structure of a photosensor in some embodiments according to the present disclosure. As shown in FIG. 3, the photosensor in some embodiments includes a first polarity layer PR1 configured to be provided with a bias voltage, and a second polarity layer PR2 connected to the source electrode S of the thin film transistors TFT through an electrode E, and an intrinsic region IR connecting the first polarity layer PR1 and the second polarity layer PR2. As used herein, the term intrinsic region refers to a region that can exhibit current rectification, e.g., a region that exhibits drastically different conductivities in one bias direction relative to the other.

Optionally, the photosensor PS is reversely biased when the first polarity layer PR1 is connected to a low voltage and the second polarity layer PR2 is connected to a high voltage. For example, the photosensor PS having the intrinsic region IR is in a reversely biased state when the first polarity layer PR1 is provided with a bias voltage (low voltage, e.g., −5 V to 0 V) and the second polarity layer PR2 is provided with a high voltage (e.g., 0 V or greater than 0 V). In some embodiments, the photosensor PS is a PN photodiode having a P+ doping semiconductor region as the first polarity layer PR1 and an N+ doping semiconductor region as the second polarity layer PR2. In some embodiments, the photosensor PS is a PIN photodiode having a P+ doping semiconductor region as the first polarity layer PR1, an N+ doping semiconductor region as the second polarity layer PR2, and an intrinsic region of amorphous silicon between the P+ doping semiconductor region and the N+ doping semiconductor region. Optionally, at least the second polarity layer PR2 includes amorphous silicon, e.g., a doped amorphous silicon.

Figure 4:
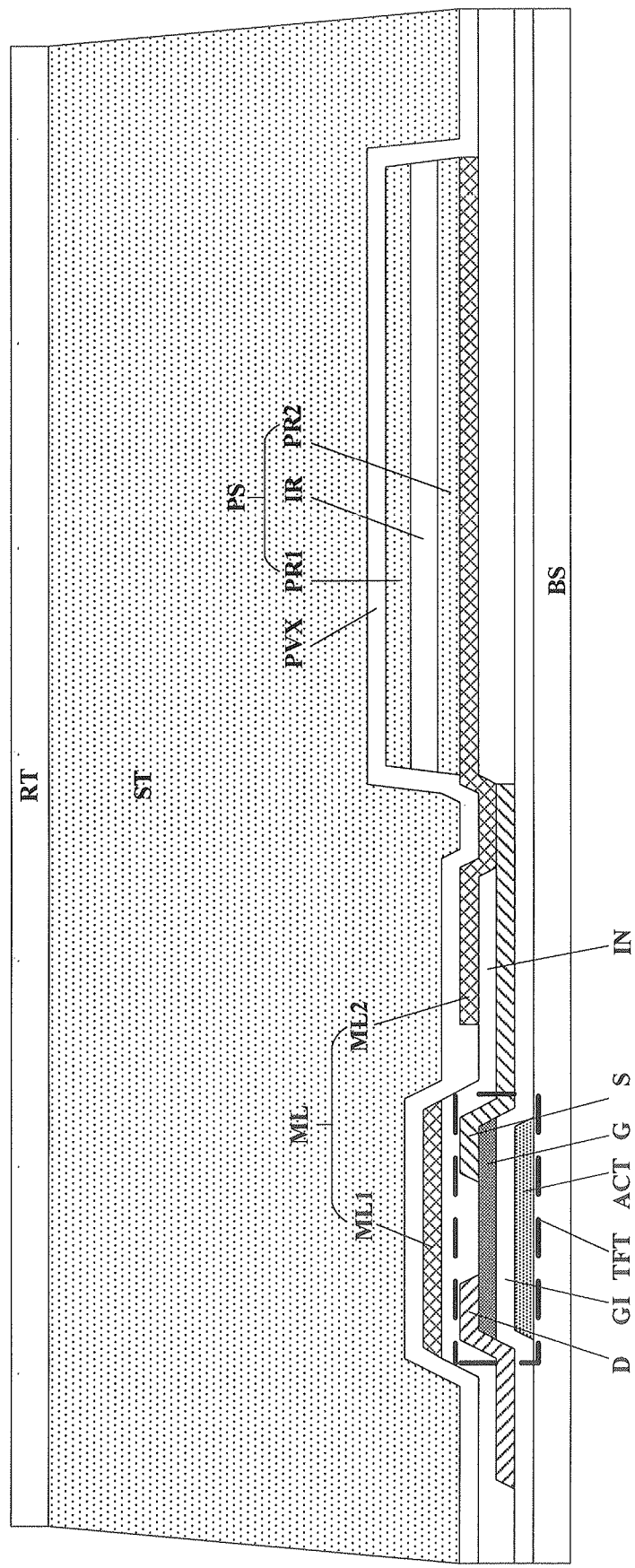
FIG. 4 is a cross-sectional view of a pixel of a radiation detector in some embodiments according to the present disclosure.

FIG. 4 is a cross-sectional view of a pixel of a radiation detector in some embodiments according to the present disclosure. For example, FIG. 4 shows a cross-sectional view along an A-A' line in FIG. 1B. Referring to FIG. 4, a respective one of the plurality of pixels of the radiation detector in some embodiments includes a base substrate BS; a thin film transistor TFT on the base substrate BS; an insulating layer IN on a side of the thin film transistor TFT away from the base substrate BS; a photosensor PS on a side of the insulating layer IN away from the base substrate BS; a passivation layer PVX on a side of the photosensor PS away from the base substrate BS; a scintillation layer ST on a side of the passivation layer PVX away from the base substrate BS; and a reflective layer RT on a side of the scintillation layer ST away from the base substrate BS. In some embodiments, the photosensor PS includes a first polarity layer PR1 in direct contact with the passivation layer PVX, a second polarity layer PR2 connected to a source electrode S of the thin film transistor TFT, and an intrinsic region IR connecting the first polarity layer PR1 and the second polarity layer PR2. Optionally, the first polarity layer PR1 is substantially covered by the passivation layer PVX other than a side internal to the photosensor PS. For example, when the photosensor PS has a PIN structure as shown in FIG. 4, the first polarity layer PR1 is substantially covered by the passivation layer PVX other than a side connected to the intrinsic region IR. As used herein, the term "substantially covered" refers to at least 50%, at least 60%, at least 70%, at least 80%, at least 90%, at least 95%, at least 99%, or 100% covered.

Figure 5:
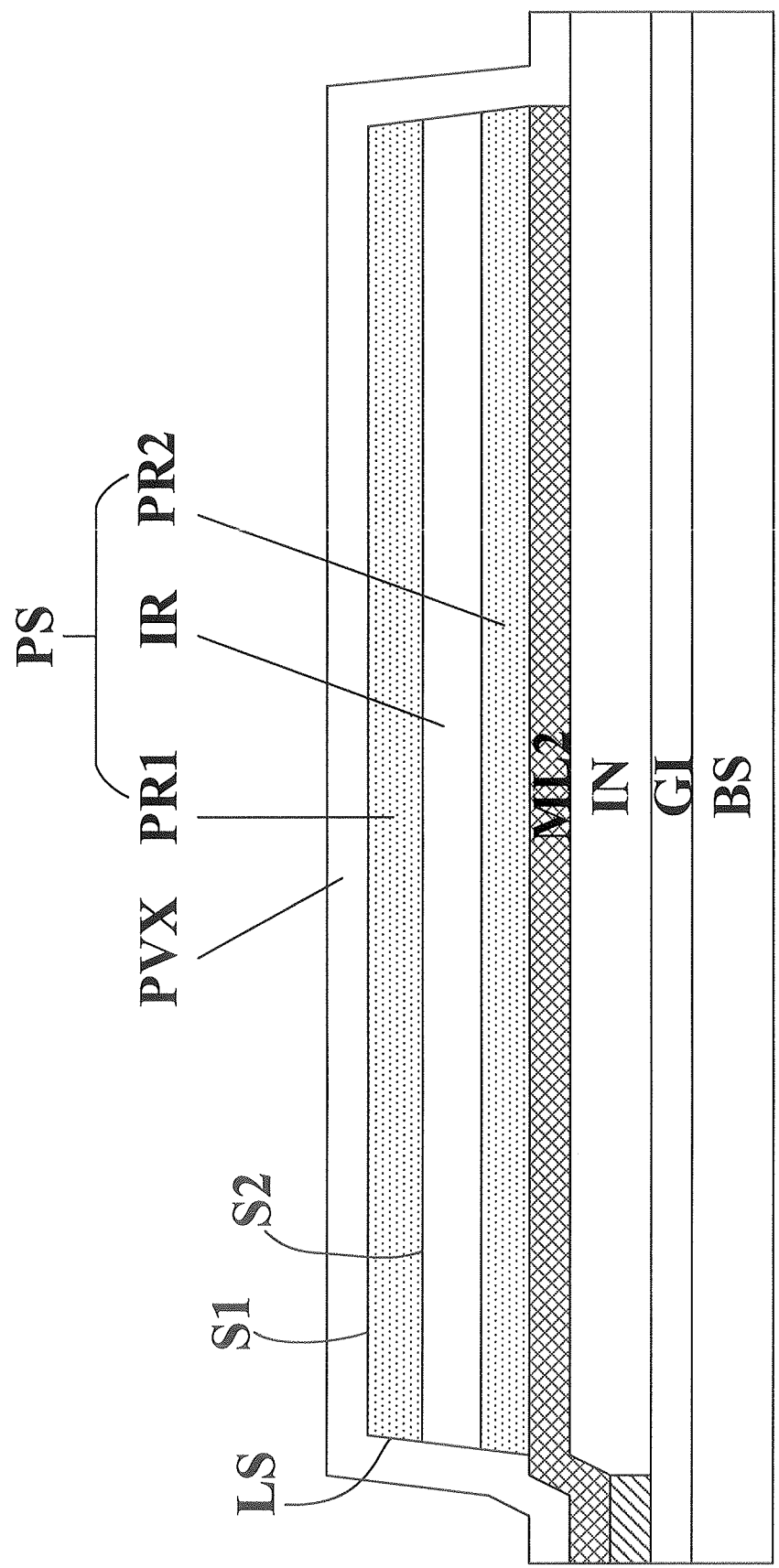
FIG. 5 is a zoom-in view of a region corresponding to a photosensor in a radiation detector in some embodiments according to the present disclosure.

FIG. 5 is a zoom-in view of a region corresponding to a photosensor in a radiation detector in some embodiments according to the present disclosure. Referring to FIG. 5, the first polarity layer PR1 in some embodiments has a first side S1 in direct contact with the passivation layer PVX, a second side S2 opposite to the first side S1, and a lateral side LS connecting the first side S1 and the second side S2. The second side S2 is internal to the photosensor PS. In one example, the second side S2 is connected to the intrinsic region IR. As shown in FIG. 5, the first side S1 and the lateral side LS of the first polarity layer PR1 (e.g., sides of the first polarity layer PR1 not internal to the photosensor PS) is substantially covered by the passivation layer PVX. Accordingly, in some embodiments, the first polarity layer PR1 is in direct contact with the passivation layer PVX on the first side S1 and the lateral side LS, and in direct contact with the intrinsic region IR on the second side S2. In some embodiments, all sides of the first polarity layer PR1 other than a side internal to the photosensor PS are entirely in direct contact with the passivation layer PVX. For example, the first side S1 and the lateral side LS of the first polarity layer PR1, but not the second side S2 (the side internal to the photosensor PS), are entirely in direct contact with the passivation layer PVX.

In some embodiments, the passivation layer PVX is an insulating layer, and the intrinsic region IR is a semiconductor component, the first polarity layer PR1 is not in direct contact with a conductive material. Optionally, the first polarity layer PR1 is not in direct contact with a conductive material at least on the first side S1 and on the lateral side LS.

As used herein, the term "conductive" material shall mean a material with a volume resistivity of $10^{-2}$ ohm-centimeter or less at room temperature, e.g., $10^{-3}$ ohm-centimeter or less, $10^{-4}$ ohm-centimeter or less, $10^{-5}$ ohm-centimeter or less, $10^{-6}$ ohm-centimeter or less, $10^{-7}$ ohm-centimeter or less, $10^{-8}$ ohm-centimeter or less, $10^{-9}$ ohm-centimeter or less, or $10^{-10}$ ohm-centimeter or less. Examples of conductive materials include various metals and alloys, various conducting oxides such as indium tin oxide and indium zinc oxide. For example, indium tin oxide has a volume resistivity in a range of $10^{-4}$ ohm-centimeter to $10^{-3}$ ohm-centimeter.

The term "insulating" material shall mean a material with a volume resistivity of $10^{10}$ ohm-centimeter or greater at room temperature, e.g., $10^{11}$ ohm-centimeter or greater, $10^{12}$ ohm-centimeter or greater, $10^{13}$ ohm-centimeter or greater, $10^{14}$ ohm-centimeter or greater, $10^{15}$ ohm-centimeter or greater, or $10^{16}$ ohm-centimeter or greater. Examples of insulating materials includes various organic insulating materials such as organic polymers, and various inorganic insulating materials such as silicon dioxide, silicon nitride, and silicon oxynitride. For example, silicon dioxide has a volume resistivity approximately $10^{14}$ ohm-centimeter. Silicon nitride has a volume resistivity in a range of $10^{14}$ ohm-centimeter to $10^{16}$ ohm-centimeter.

As used herein, the term "semiconductive" material shall mean a material with a volume resistivity between $10^{-2}$ ohm-centimeter and $10^{10}$ ohm-centimeter at room temperature, e.g., between $10^{-2}$ ohm-centimeter and $10^{-1}$ ohm-centimeter, between $10^{-1}$ ohm-centimeter and $10^{0}$ ohm-centimeter, between $10^{0}$ ohm-centimeter and $10^{1}$ ohm-centimeter, between $10^{1}$ ohm-centimeter and $10^{2}$ ohm-centimeter, between $10^{2}$ ohm-centimeter and $10^{3}$ ohm-centimeter, between $10^{3}$ ohm-centimeter and $10^{4}$ ohm-centimeter, between $10^{4}$ ohm-centimeter and $10^{5}$ ohm-centimeter, between $10^{5}$ ohm-centimeter and $10^{6}$ ohm-centimeter, between $10^{6}$ ohm-centimeter and $10^{7}$ ohm-centimeter, between $10^{7}$ ohm-centimeter and $10^{8}$ ohm-centimeter, between $10^{8}$ ohm-centimeter and $10^{9}$ ohm-centimeter, or between $10^{9}$ ohm-centimeter and $10^{10}$ ohm-centimeter. Indium tin oxide and indium zinc oxide are an example of a conductive material. Examples of semiconductive materials includes various silicon-containing materials such as amorphous silicon and polycrystalline silicon, and various semiconductive materials such as indium gallium tin oxide. For example, amorphous silicon has a volume resistivity approximately $10^{9}$ ohm-centimeter.

In some embodiments, the first polarity layer PR1 is not in direct contact with a metal oxide layer, e.g., a layer made of indium tin oxide or indium zinc oxide. Optionally, the first polarity layer PR1 is not in direct contact with a substantially transparent metal oxide layer. Optionally, the first polarity layer PR1 is only in direct contact with layers containing silicon. Optionally, the first polarity layer PR1 is not in direct contact with a conductive layer that contains a metal oxide.

As discussed above, a bias voltage Vb is provided to the photosensor PS, e.g., to a first polarity layer PR1 of the photosensor PS. In some embodiments, and referring to FIG. 4 and FIG. 5, the radiation detector is absent of any bias voltage signal line connected to the first polarity layer PR1, and is absent of any bias electrode directly connected to the first polarity layer PR1. For example, the bias voltage Vb is provided to the photosensor PS through the passivation layer PVX in direct contact with the first polarity layer PR1 of the photosensor PS.

Figure 6:
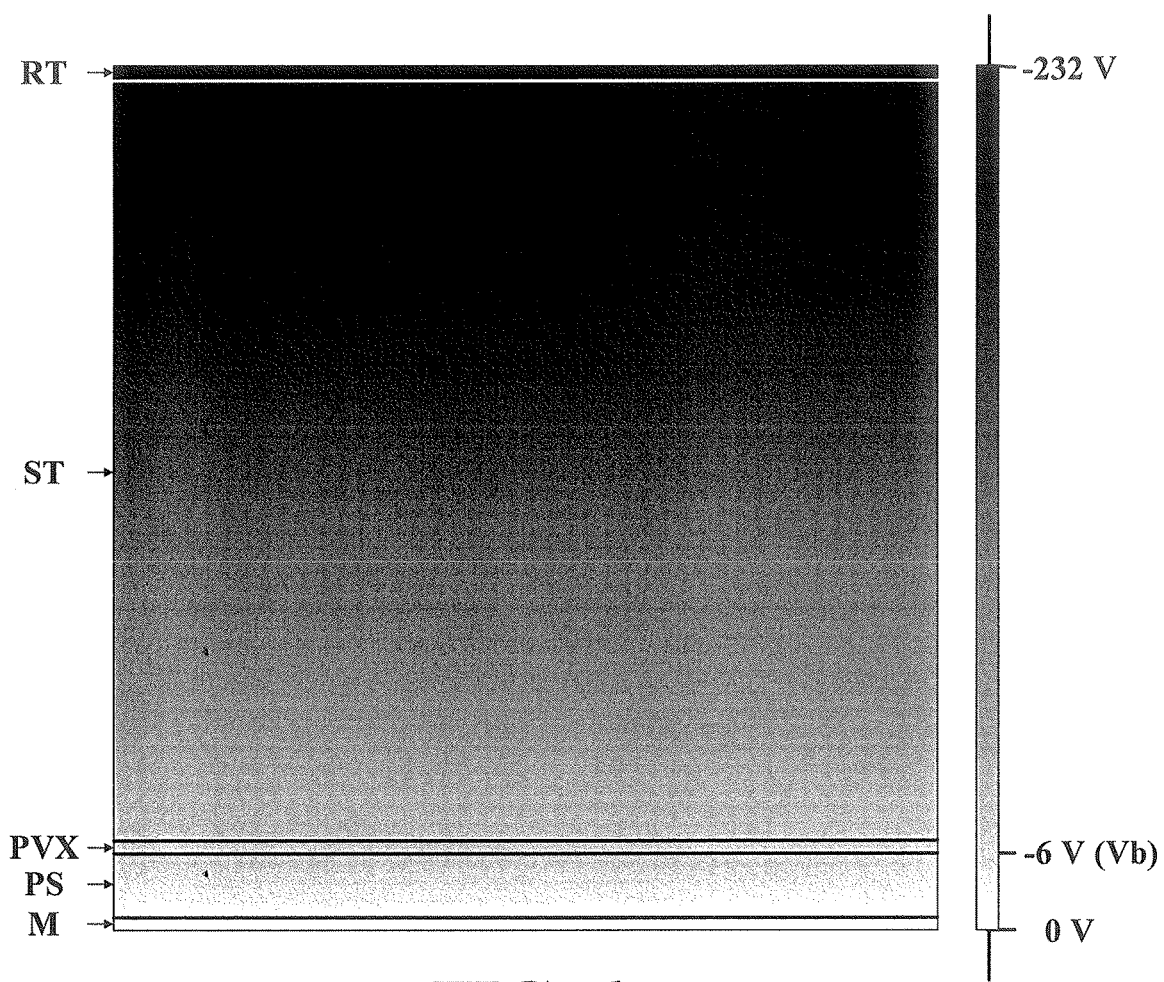
FIG. 6 illustrates an example of achieving a bias voltage at a first polarity layer of a photosensor by applying a negative voltage to a reflective layer of a radiation detector in some embodiments according to the present disclosure.

In one example, a negative voltage Vn is applied to the reflective layer RT to achieve a voltage level required for the bias voltage Vb at the first polarity layer PR1. FIG. 6 illustrates an example of achieving a bias voltage at a first polarity layer of a photosensor by applying a negative voltage to a reflective layer of a radiation detector in some embodiments according to the present disclosure. Referring to FIG. 4, FIG. 5, and FIG. 6, the radiation detector in some embodiments further includes a metallic layer ML on a side of the insulating layer IN away from the base substrate BS. In one example, the metallic layer ML has a thickness of 0.2 μm, the photosensor has a thickness of 1.0 μm, the passivation layer PVX has a thickness of 0.2 μm, the scintillation layer ST has a thickness of 50 μm, and the reflective layer RT has a thickness of 0.2 μm. As shown in FIG. 6, a negative voltage Vn of −232 V is applied to the reflective layer RT, the voltage level from the reflective layer RT to the metallic layer ML gradually increases from −232 V to 0 V. A bias voltage of −6 V is achieved at a surface of the photosensor PS in direct contact with the passivation layer PVX. Because the voltage level increases to 0 V at the metallic layer ML, the negative voltage applied to the reflective layer RT does not adversely affect the normal operation of the thin film transistor TFT.

Because the radiation detector is absent of any bias electrode directly connected to the first polarity layer PR1, and is absent of any bias voltage signal line connected to the first polarity layer PR1, in some embodiments, in the plurality of pixels, the radiation detector is substantially absent of any via extending through the passivation layer PVX. Optionally, the passivation layer PVX is a unitary layer extending throughout the plurality of pixels. As used herein, the term "substantially absent" means at least 50 percent (e.g., at least 60 percent, at least 70 percent, at least 80 percent, at least 90 percent, and at least 95 percent, or 100 percent) absent. Optionally, in the plurality of pixels, the radiation detector is completely absent of any via extending through the passivation layer PVX, as shown in FIG. 4.

Optionally, in a peripheral area of the radiation detector, the radiation detector may include one or more vias extending through the passivation layer PVX. Optionally, the radiation detector is absent of any via extending through the passivation layer PVX in a region corresponding to the photosensor PS to connect components on two sides of the passivation layer PVX.

Figure 7A:
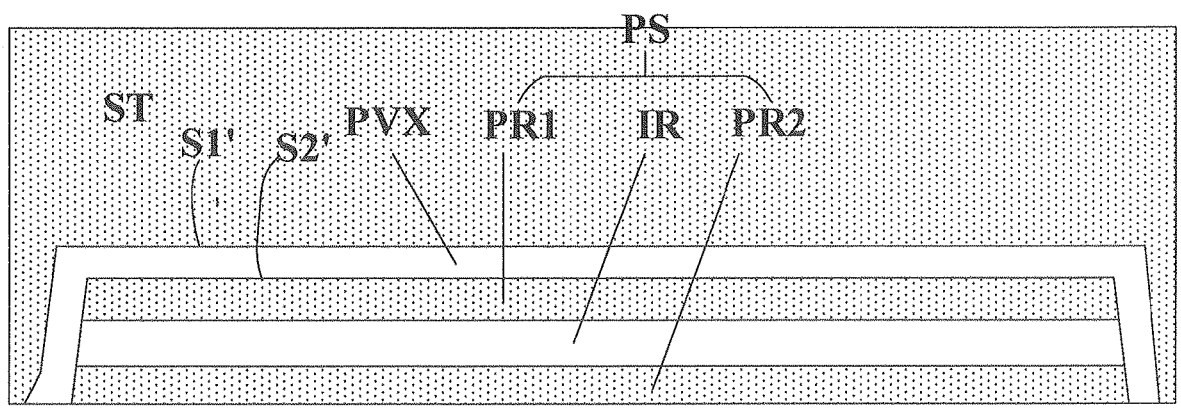
FIG. 7A is a zoom-in view of a region corresponding to a photosensor in a radiation detector in some embodiments according to the present disclosure.
Figure 7B:
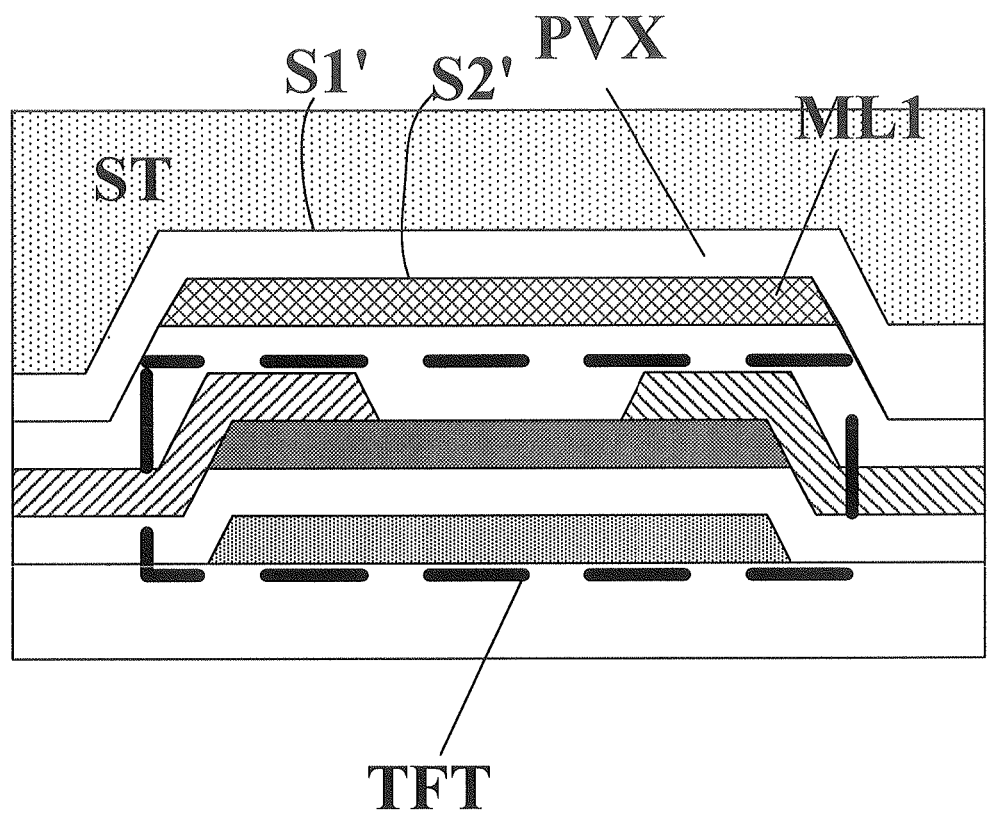
FIG. 7B is a zoom-in view of a region corresponding to a first part of a metallic layer in a radiation detector in some embodiments according to the present disclosure.

Referring to FIG. 4, in some embodiments, the first polarity layer PR1 is spaced apart from the scintillation layer ST by the passivation layer PVX. FIG. 7A is a zoom-in view of a region corresponding to a photosensor in a radiation detector in some embodiments according to the present disclosure. Referring to FIG. 7A and FIG. 4, in some embodiments, the passivation layer PVX is in direct contact with the scintillation layer ST on a first side S1', and is in direct contact with the first polarity layer PR1 on a second side S2' opposite to the first side S1', in a region corresponding to the photosensor PS. FIG. 7B is a zoom-in view of a region corresponding to a first part of a metallic layer in a radiation detector in some embodiments according to the present disclosure. Referring to FIG. 7B and FIG. 4, in some embodiments, the passivation layer PVX is in direct contact with the scintillation layer ST on the first side S1', and is in direct contact with the first part ML1 on the second side S2' opposite to the first side S1', in a region corresponding to the first part ML1.

Referring to FIG. 4, the radiation detector in some embodiments further includes a metallic layer ML on a side of the insulating layer IN away from the base substrate BS. In some embodiments, the metallic layer ML includes a first part ML1 and a second part ML2 in a same layer and spaced apart from each other. As used herein, the term "same layer" refers to the relationship between the layers simultaneously formed in the same step. In one example, the first part ML1 and the second part ML2 are in a same layer when they are formed as a result of one or more steps of a same patterning process performed in a material deposited in a same deposition process. In another example, the first part ML1 and the second part ML2 can be formed in a same layer by simultaneously performing the step of forming the first part ML1 and the step of forming the second part ML2. The term "same layer" does not always mean that the thickness of the layer or the height of the layer in a cross-sectional view is the same. The first part ML1 is on a side of the insulating layer IN away from an active layer ACT of the thin film transistor TFT, and configured to shield light from irradiating on the active layer ACT. The second part ML2 is between the insulating layer IN and the second polarity layer PR2, is electrically connected to the second polarity layer PR2, and extends through the insulating layer IN to connect to a source electrode S of the thin film transistor TFT.

Figure 8A:
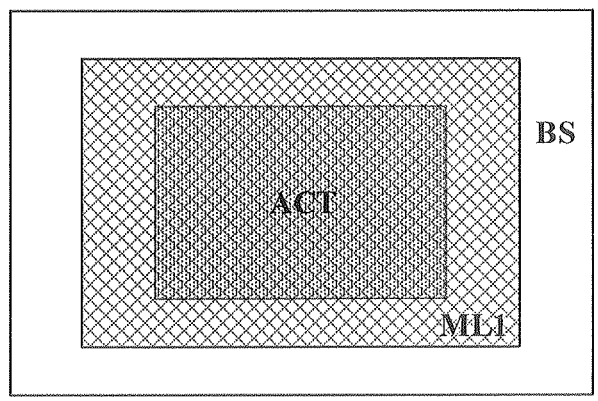
FIG. 8A is a plan view of an active layer of a thin film transistor and a first part of a metallic layer in a radiation detector in some embodiments according to the present disclosure.

In some embodiments, an orthographic projection of the first part ML1 on the base substrate BS at least partially overlaps with an orthographic projection of the active layer ACT of the thin film transistor TFT on the base substrate BS. FIG. 8A is a plan view of an active layer of a thin film transistor and a first part of a metallic layer in a radiation detector in some embodiments according to the present disclosure. Referring to FIG. 8A, in some embodiments, the orthographic projection of the first part ML1 on the base substrate BS covers the orthographic projection of the active layer ACT of the thin film transistor TFT on the base substrate BS. Optionally, the orthographic projection of the first part ML1 on the base substrate BS is completely non-overlapping with the orthographic projection of the photosensor PS on the base substrate BS.

Figure 8B:
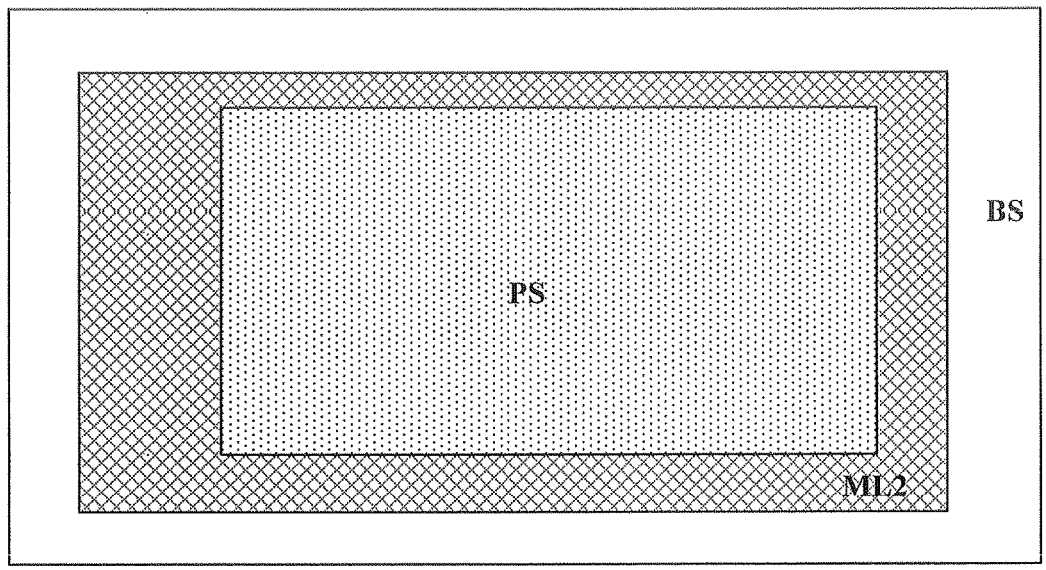
FIG. 8B is a plan view of a photosensor and a second part of a metallic layer in a radiation detector in some embodiments according to the present disclosure.

In some embodiments, an orthographic projection of the second part ML2 on the base substrate BS at least partially overlaps with an orthographic projection of the photosensor PS on the base substrate BS. FIG. 8B is a plan view of a photosensor and a second part of a metallic layer in a radiation detector in some embodiments according to the present disclosure. Referring to FIG. 8B, in some embodiments, the orthographic projection of the second part ML2 on the base substrate BS covers the orthographic projection of the photosensor PS on the base substrate BS. Optionally, the orthographic projection of the second part ML2 on the base substrate BS is completely non-overlapping with the orthographic projection of the active layer ACT of the thin film transistor TFT on the base substrate BS. Because the radiation detector is absent of any bias electrode directly connected to the first polarity layer PR1, and is absent of any bias voltage signal line connected to the first polarity layer PR1, in some embodiments, in a region corresponding to the photosensor PS, the radiation detector is absent of any metallic layer between the second part ML2 and the reflective layer RT. Optionally, the orthographic projection of the photosensor PS on the base substrate BS is substantially non-overlapping with an orthographic projection on the base substrate BS of any metallic layer between the second part ML2 and the reflective layer RT. As used herein, the term "substantially non-overlapping" refers to two orthographic projections being at least 50 percent (e.g., at least 60 percent, at least 70 percent, at least 80 percent, at least 90 percent, at least 95 percent, at least 99 percent, and 100 percent) non-overlapping. Optionally, the orthographic projection of the photosensor PS on the base substrate BS is completely non-overlapping with an orthographic projection on the base substrate BS of any metallic layer between the second part ML2 and the reflective layer RT.

In some embodiments, the reflective layer RT is a unitary layer extending throughout the plurality of pixels. When the negative voltage Vn is applied to the reflective layer RT, the bias voltage Vb can be achieved at the first polarity layer PR1 in the photosensor in each of the plurality of pixels. In some embodiments, the reflective layer RT includes a plurality of reflective blocks respectively in the plurality of pixels, and the plurality of reflective blocks are spaced apart from each other.

In some embodiments, the radiation detector includes a radiation source for generating radiation, such as an X-ray or gamma ray. The radiation detector includes a plurality of pixels, e.g., photosensitive pixels for sensing the radiation. The scintillator layer ST converts the radiation to light, and the photosensor PS converts the light into electrical charges. Based on the electrical charges, the radiation detector outputs a detection signal corresponding to the amount of radiation in each pixel. Optionally, the radiation detector is an X-ray detector. Optionally, the radiation detector is a gamma ray detector.

In another aspect, the present disclosure provides a method of operating a radiation detector. In some embodiments, the method includes providing a bias voltage to the first polarity layer by providing a voltage signal to the reflective layer to achieve the bias voltage at the first polarity layer. Optionally, the voltage signal provided to the reflective layer is a first negative voltage; the bias voltage has a second negative voltage; and an absolute value of the first negative voltage is greater than an absolute value of the second negative voltage.

In another aspect, the present disclosure provides a method of fabricating a radiation detector having a plurality of pixels. In some embodiments, fabricating a respective one of the plurality of pixels includes forming a thin film transistor on a base substrate; forming an insulating layer on a side of the thin film transistor away from the base substrate; forming a photosensor on a side of the insulating layer away from the base substrate; forming a passivation layer on a side of the photosensor away from the base substrate; forming a scintillation layer on a side of the passivation layer away from the base substrate; and forming a reflective layer on a side of the scintillation layer away from the base substrate. Optionally, forming the photosensor includes forming a first polarity layer and forming a second polarity layer. Optionally, the first polarity layer is formed to be in direct contact with the passivation layer. Optionally, the second polarity layer is formed to be connected to a source electrode of the thin film transistor. Optionally, all sides of the first polarity layer other than a side internal to the photosensor are entirely in direct contact with the passivation layer.

In some embodiments, a total number of steps of depositing an insulating material, subsequent to forming the photosensor and prior to forming the scintillation layer, is one. Optionally, the only step of depositing an insulating material, subsequent to forming the photosensor and prior to forming the scintillation layer, is a step of depositing an insulating material to form the passivation layer PVX.

In some embodiments, the method further includes forming a metallic layer on a side of the insulating layer away from the base substrate. Optionally, forming the metallic layer includes forming a first part and forming a second part in a same layer and spaced apart from each other. Optionally, the first part and the second part are formed in a same patterning process using a same mask plate and a same material. Optionally, the first part is formed on a side of the insulating layer away from an active layer of the thin film transistor, and configured to shield light from irradiating on the active layer. Optionally, the second part is formed between the insulating layer and the second polarity layer, is electrically connected to the second polarity layer, and extends through the insulating layer to connect to a source electrode of the thin film transistor.

In some embodiments, forming the passivation layer includes depositing an insulating material in direct contact with the photosensor and the metallic layer, subsequent to forming the photosensor without any intermediate deposition step. Optionally, no via connecting components on two sides of the passivation layer is formed to extend through the passivation layer in a region corresponding to the photosensor. Optionally, forming the scintillation layer includes depositing a scintillation material, subsequent to forming the passivation layer, without any intermediate deposition step. The scintillation material is deposited to be in direct contact with the passivation layer.

In some embodiments, the metallic layer and the photosensor are formed so that an orthographic projection of the first part on the base substrate is completely non-overlapping with an orthographic projection of the photosensor on the base substrate.

In some embodiments, the photosensor are formed so that an orthographic projection of the photosensor on the base substrate is substantially non-overlapping with an orthographic projection on the base substrate of any metallic layer between the second part and the reflective layer.

In some embodiments, the first polarity layer is formed to be spaced apart from the scintillation layer by the passivation layer; and the passivation layer is formed to be in direct contact with the scintillation layer on a first side, and in direct contact with the first polarity layer on a second side opposite to the first side, in a region corresponding to the photosensor.

Various appropriate insulating materials and various appropriate fabricating methods may be used to make the passivation layer. For example, an insulating material may be deposited on the substrate by a plasma-enhanced chemical vapor deposition (PECVD) process. Examples of appropriate insulating materials for making the passivation layer include, but are not limited to, silicon oxide ($SiO_y$), silicon nitride ($SiN_y$, e.g., $Si_3N_4$), silicon oxynitride ($SiO_xN_y$), a resin, and polyimide.

Various appropriate insulating materials and various appropriate fabricating methods may be used to make the insulating layer. For example, an insulating material may be deposited on the substrate by a plasma-enhanced chemical vapor deposition (PECVD) process. Examples of appropriate insulating materials for making the insulating layer include, but are not limited to, silicon oxide ($SiO_y$), silicon nitride ($SiN_y$, e.g., $Si_3N_4$), silicon oxynitride ($SiO_xN_y$), a resin, and polyimide.

Any appropriate scintillator materials may be used for making the scintillator layer. In some embodiments, the scintillator material is a conversion material that converts radiation (e.g., X-ray) to visible light. Examples of scintillator materials include, but are not limited to, cesium iodide activated by thallium (CsI(Tl)), cesium iodide activated by sodium (CsI(Na)), sodium iodide activated by thallium (NaI(Tl)), zinc sulfide or zinc oxide (ZnS or ZnO), yttrium aluminum perovskite activated by cerium (YAP(Ce)), yttrium aluminum garnet activated by cerium (YAG(Ce), bismuth germinate (BGO), calcium fluoride activated by europium (CaF(Eu)), lutetium aluminum garnet activated by cerium (LuAG(Ce)), gadolinium silicate doped with cerium (GSO), cadmium tungstate (CdWO4; CWO), lead tungstate (PbWO4; PWO), double tungstate of sodium and bismuth (NaBi(WO4)2; NBWO), zinc selenide doped with tellurium (ZnSe(Te)), lanthanum bromide activated by cerium (LaBr3 (Ce)), cerium bromide (CeBr3), or lanthanum chloride activated by cerium (LaCl3(Ce)), or a combination thereof. Optionally, the scintillator material is cesium iodide activated by thallium (CsI(Tl)).

Various appropriate materials and various appropriate fabricating methods may be used for making the metallic layer and/or the reflective layer. For example, a metallic material may be deposited on the substrate by a plasma-enhanced chemical vapor deposition (PECVD) process. Examples of appropriate metallic materials for making the metallic layer and/or the reflective layer include, but are not limited to, aluminum, chromium, tungsten, titanium, tantalum, molybdenum, copper, and alloys or laminates containing the same.

Figure 9A:
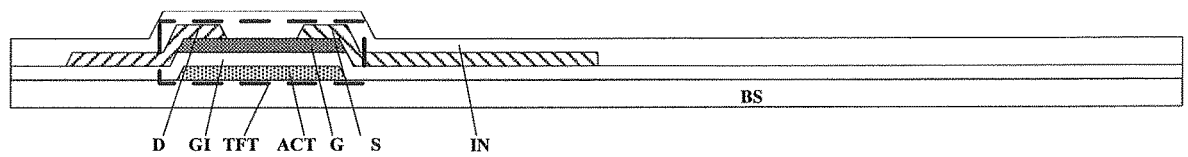
FIGS. 9A to 9E illustrate a method of fabricating a radiation detector in some embodiments according to the present disclosure.

FIGS. 9A to 9E illustrate a method of fabricating a radiation detector in some embodiments according to the present disclosure. Referring to FIG. 9A, a thin film transistor TFT is formed on a base substrate BS; and an insulating layer IN is formed on a side of the thin film transistor TFT away from the base substrate BS.

Figure 9B:
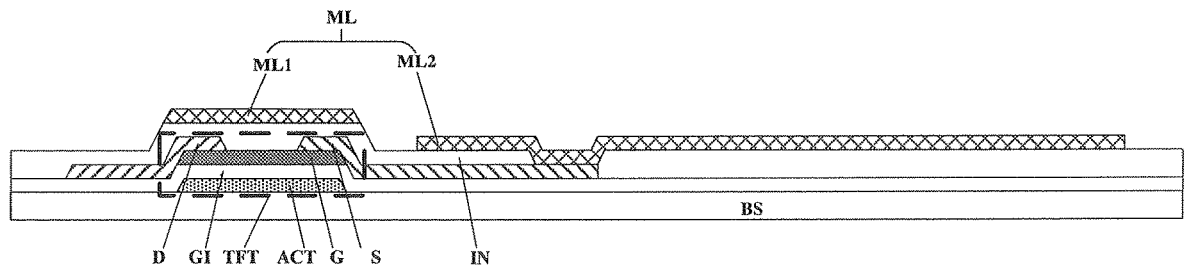

Referring to FIG. 9B, a metallic layer ML is formed on a side of the insulating layer IN away from the base substrate BS. For example, a metallic material layer may be deposited on the insulating layer IN, and the metallic material layer is patterned to form a first part ML1 and a second part ML2, thereby forming the metallic layer ML. The first part ML1 is formed so that an orthographic projection of the first part M1 on the base substrate BS covers an orthographic projection of the active layer ACT of the thin film transistor TFT on the base substrate BS. The second part ML2 is formed to extend through the insulating layer IN to connect to the source electrode S of the thin film transistor TFT.

Figure 9C:
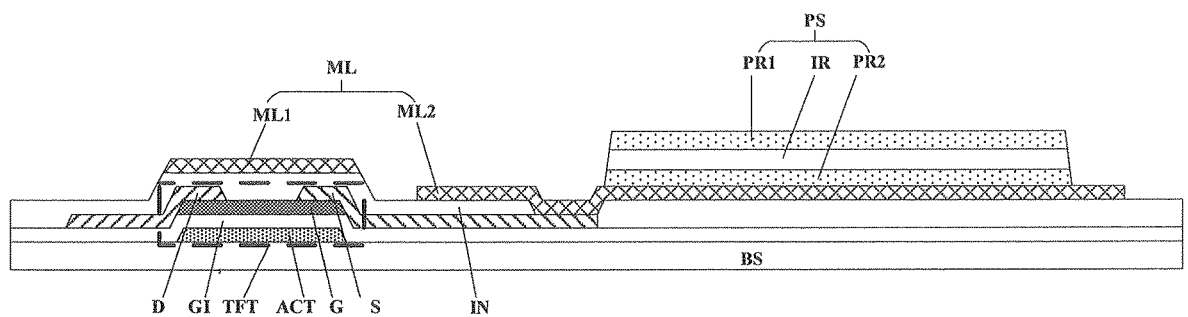

Referring to FIG. 9C, a photosensor PS is formed on a side of the second part ML2 away from the base substrate BS. The photosensor PS is formed so that an orthographic projection of the second part ML2 on the base substrate BS covers an orthographic projection of the photosensor PS on the base substrate BS. Forming the photosensor PS includes forming a second polarity layer PR2 in direct contact with the second part ML2 of the metallic layer ML; forming an intrinsic region IR on a side of the second polarity layer PR2 away from the second part ML2 of the metallic layer ML; and forming a first polarity layer PR1 on a side of the intrinsic region IR away from the second part ML2 of the metallic layer ML.

Figure 9D:
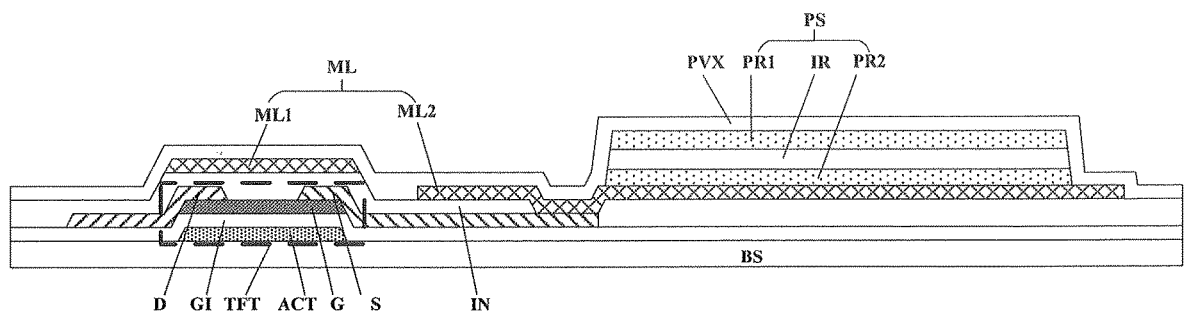

Referring to FIG. 9D, subsequent to forming the photosensor PS, and without any intermediate step, a passivation layer PVX is formed on a side of the photosensor PS and the first part ML1 of the metallic layer ML away from the base substrate BS. The passivation layer PVX is formed to be in direct contact with the first polarity layer PR1, and in direct contact with the first part ML1 of the metallic layer ML. The passivation layer PVX is formed so that all sides of the first polarity layer PR1 other than a side internal to the photosensor are entirely in direct contact with the passivation layer PVX.

Figure 9E:
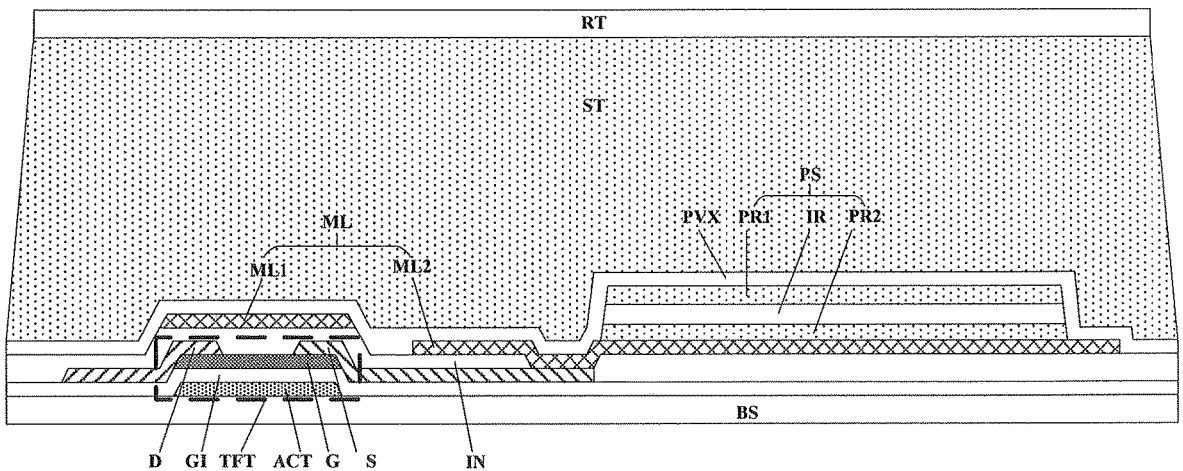

Referring to FIG. 9E, a scintillation layer ST is formed on a side of the passivation layer PVX away from the base substrate BS; and a reflective layer RT is formed on a side of the scintillation layer ST away from the base substrate BS.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A radiation detector having a plurality of pixels, wherein a respective one of the plurality of pixels comprises:
   a base substrate;
   a thin film transistor on the base substrate;
   an insulating layer on a side of the thin film transistor away from the base substrate;
   a metallic layer on a side of the insulating layer away from the base substrate;
   a photosensor on a side of the insulating layer away from the base substrate;
   a passivation layer on a side of the photosensor away from the base substrate;
   a scintillation layer on a side of the passivation layer away from the base substrate; and
   a reflective layer on a side of the scintillation layer away from the base substrate;
   wherein the photosensor comprises a first polarity layer in direct contact with the passivation layer, and a second polarity layer connected to a source electrode of the thin film transistor; and
   wherein all sides of the first polarity layer other than a side internal to the photosensor are entirely in direct contact with the passivation layer;
   wherein the metallic layer comprises a first part and a second part in a same layer and spaced apart from each other;
   the first part is on a side of the insulating layer away from an active layer of the thin film transistor, and configured to shield light from irradiating on the active layer; and
   the second part is between the insulating layer and the second polarity layer, is electrically connected to the second polarity layer, and extends through the insulating layer to connect to a source electrode of the thin film transistor.

2. The radiation detector of claim 1, wherein the radiation detector is absent of any bias voltage signal line connected to the first polarity layer, and is absent of any bias electrode directly connected to the first polarity layer.

3. The radiation detector of claim 1, wherein the passivation layer is a unitary layer extending throughout the plurality of pixels; and
   in the plurality of pixels, the radiation detector is substantially absent of any via extending through the passivation layer.

4. The radiation detector of claim 1, wherein the first polarity layer is spaced apart from the scintillation layer by the passivation layer; and
   the passivation layer is in direct contact with the scintillation layer on a first side, and is in direct contact with the first polarity layer on a second side opposite to the first side, in a region corresponding to the photosensor.

5. The radiation detector of claim 1, wherein the passivation layer is in direct contact with the scintillation layer on a first side, and is in direct contact with the first part on a second side opposite to the first side, in a region corresponding to the first part.

6. The radiation detector of claim 1, wherein an orthographic projection of the first part on the base substrate is completely non-overlapping with an orthographic projection of the photosensor on the base substrate; and
   the orthographic projection of the first part on the base substrate covers an orthographic projection of the active layer on the base substrate.

7. The radiation detector of claim 1, wherein an orthographic projection of the photosensor on the base substrate is substantially non-overlapping with an orthographic projection on the base substrate of any metallic layer between the second part and the reflective layer.

8. The radiation detector of claim 1, wherein the radiation detector is absent of any via extending through the passivation layer in a region corresponding to the photosensor to connect components on two sides of the passivation layer.

9. The radiation detector of claim 1, wherein the reflective layer is a unitary layer extending throughout the plurality of pixels.

10. The radiation detector of claim 1, wherein the radiation detector is an x-ray detector.

11. A method of operating a radiation detector, wherein the radiation detector comprises a plurality of pixels, wherein a respective one of the plurality of pixels comprises:
  a base substrate;
  a thin film transistor on the base substrate;
  an insulating layer on a side of the thin film transistor away from the base substrate;
  a photosensor on a side of the insulating layer away from the base substrate;
  a passivation layer on a side of the photosensor away from the base substrate;
  a scintillation layer on a side of the passivation layer away from the base substrate; and
  a reflective layer on a side of the scintillation layer away from the base substrate;
  wherein the photosensor comprises a first polarity layer in direct contact with the passivation layer, and a second polarity layer connected to a source electrode of the thin film transistor; and
  wherein all sides of the first polarity layer other than a side internal to the photosensor are entirely in direct contact with the passivation layer;
  wherein the method comprises:
  providing a bias voltage to the first polarity layer by providing a voltage signal to the reflective layer to achieve the bias voltage at the first polarity layer
  wherein the voltage signal provided to the reflective layer is a first negative voltage;
  the bias voltage provided to the first polarity layer has a second negative voltage; and
  an absolute value of the first negative voltage is greater than an absolute value of the second negative voltage.

12. A method of fabricating a radiation detector having a plurality of pixels;
  wherein fabricating a respective one of the plurality of pixels comprises:
  forming a thin film transistor on a base substrate;
  forming an insulating layer on a side of the thin film transistor away from the base substrate;
  forming a metallic layer on a side of the insulating layer away from the base substrate;
  forming a photosensor on a side of the insulating layer away from the base substrate;
  forming a passivation layer on a side of the photosensor away from the base substrate;
  forming a scintillation layer on a side of the passivation layer away from the base substrate; and
  forming a reflective layer on a side of the scintillation layer away from the base substrate;
  wherein forming the photosensor comprises forming a first polarity layer and forming a second polarity layer;
  the first polarity layer is formed to be in direct contact with the passivation layer;
  the second polarity layer is formed to be connected to a source electrode of the thin film transistor;
  wherein all sides of the first polarity layer other than a side internal to the photosensor are entirely in direct contact with the passivation layer;
  wherein forming the metallic layer comprises forming a first part and a second part in a same layer and spaced apart from each other;
  the first part and the second part are formed in a same patterning process using a same mask plate and a same material;
  the first part is formed on a side of the insulating layer away from an active layer of the thin film transistor, and configured to shield light from irradiating on the active layer; and
  the second part is formed between the insulating layer and the second polarity layer, is electrically connected to the second polarity layer, and extends through the insulating layer to connect to a source electrode of the thin film transistor.

13. The method of claim 12, wherein a total number of steps of depositing an insulating material, subsequent to forming the photosensor and prior to forming the scintillation layer, is one.

14. The method of claim 12, wherein forming the passivation layer comprises depositing an insulating material in direct contact with the photosensor and the metallic layer, subsequent to forming the photosensor, without any intermediate deposition step;
  no via connecting components on two sides of the passivation layer is formed to extend through the passivation layer in a region corresponding to the photosensor; and
  forming the scintillation layer comprises depositing a scintillation material, subsequent to forming the passivation layer, without any intermediate deposition step, the scintillation material is deposited to be in direct contact with the passivation layer.

15. The method of claim 12, wherein the metallic layer and the photosensor are formed so that an orthographic projection of the first part on the base substrate is completely non-overlapping with an orthographic projection of the photosensor on the base substrate.

16. The method of claim 12, wherein the photosensor are formed so that an orthographic projection of the photosensor on the base substrate is substantially non-overlapping with an orthographic projection on the base substrate of any metallic layer between the second part and the reflective layer.

17. The method of claim 12, wherein the first polarity layer is formed to be spaced apart from the scintillation layer by the passivation layer; and
  the passivation layer is formed to be in direct contact with the scintillation layer on a first side, and in direct contact with the first polarity layer on a second side opposite to the first side, in a region corresponding to the photosensor.

* * * * *